United States Patent
Tian et al.

(10) Patent No.: US 11,204,395 B2
(45) Date of Patent: Dec. 21, 2021

(54) MODULE FOR DETECTING AN ELECTRICAL FAULT FOR AN ELECTRICAL PROTECTION ASSEMBLY AND ELECTRICAL PROTECTION ASSEMBLY COMPRISING SUCH A DETECTION MODULE

(71) Applicant: Schneider Electric Industries SAS, Rueil Malmaison (FR)

(72) Inventors: Simon Tian, Eybens (FR); Claude Burnot, Echirolles (FR); Bernard Lebeau, Les Adrets (FR); Thomas Pupin, Grenoble (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 628 days.

(21) Appl. No.: 16/134,183

(22) Filed: Sep. 18, 2018

(65) Prior Publication Data
US 2019/0108962 A1    Apr. 11, 2019

(30) Foreign Application Priority Data
Oct. 11, 2017   (FR) ..................... 17 59516

(51) Int. Cl.
*G01R 31/50*    (2020.01)
*H01H 71/12*    (2006.01)
(Continued)

(52) U.S. Cl.
CPC ............. *G01R 31/50* (2020.01); *G01R 31/52* (2020.01); *H01H 71/0207* (2013.01);
(Continued)

(58) Field of Classification Search
CPC .......... H01H 71/0207; H01H 71/0271; H01H 71/125; H01H 71/0007; H01H 71/0092;
(Continued)

(56) References Cited

U.S. PATENT DOCUMENTS

| 5,446,431 A | 8/1995 | Leach et al. |
| 6,191,589 B1 | 2/2001 | Clunn |

(Continued)

FOREIGN PATENT DOCUMENTS

| EP | 0 456 585 A1 | 11/1991 |
| WO | WO 2009/089995 A1 | 7/2009 |

*Primary Examiner* — Jue Zhang
(74) *Attorney, Agent, or Firm* — Oblon, McClelland, Maier & Neustadt, L.L.P.

(57) ABSTRACT

A module for detecting an electrical fault includes a housing; a first conductor and a second conductor; a first measurement toroid, positioned around the first conductor and around the second conductor, for measuring a differential current flowing between the first and second conductors; a second measurement toroid, positioned around the first conductor, for detecting an electric arc signal flowing through this conductor; a relay; an electronic processing circuit configured to switch the relay according to the current measured by the measurement toroids. The measurement toroids are aligned with one another and the first toroid takes the shape of an elongated tube and allows the differential protection to operate with its own current.

12 Claims, 11 Drawing Sheets

(51) Int. Cl.
*H02H 1/00* (2006.01)
*H02H 3/10* (2006.01)
*H01H 71/02* (2006.01)
*H01H 83/14* (2006.01)
*G01R 31/52* (2020.01)
*H01H 71/08* (2006.01)
*G01R 15/18* (2006.01)
*H02H 3/33* (2006.01)
*H01H 83/20* (2006.01)

(52) U.S. Cl.
CPC ...... *H01H 71/0271* (2013.01); *H01H 71/125* (2013.01); *H01H 83/144* (2013.01); *H02H 1/0007* (2013.01); *H02H 1/0092* (2013.01); *H02H 3/10* (2013.01); *G01R 15/183* (2013.01); *H01H 71/08* (2013.01); *H01H 2071/088* (2013.01); *H01H 2083/201* (2013.01); *H02H 1/0015* (2013.01); *H02H 3/33* (2013.01)

(58) Field of Classification Search
CPC ...... H01H 71/08; H01H 71/0015; H01H 3/10; H01H 83/144; H01H 2071/088; H01H 2083/201; G01R 31/50; G01R 31/52; G01R 15/183
See application file for complete search history.

(56) References Cited

U.S. PATENT DOCUMENTS

| | | | |
|---|---|---|---|
| 6,288,882 | B1 | 9/2001 | Disalvo et al. |
| 6,728,085 | B2 * | 4/2004 | Dudhwala ............ H01H 71/123 361/42 |
| 2002/0006022 | A1 | 1/2002 | Disalvo et al. |
| 2002/0184207 | A1 | 12/2002 | Anderson et al. |
| 2008/0186116 | A1 | 8/2008 | Disalvo et al. |
| 2009/0184787 | A1 * | 7/2009 | Weeks ................... H01H 71/58 335/18 |
| 2012/0273334 | A1 * | 11/2012 | Ganley ............. H01H 71/2409 200/400 |
| 2015/0333498 | A1 * | 11/2015 | Weeks ................... G01R 31/52 361/42 |

* cited by examiner

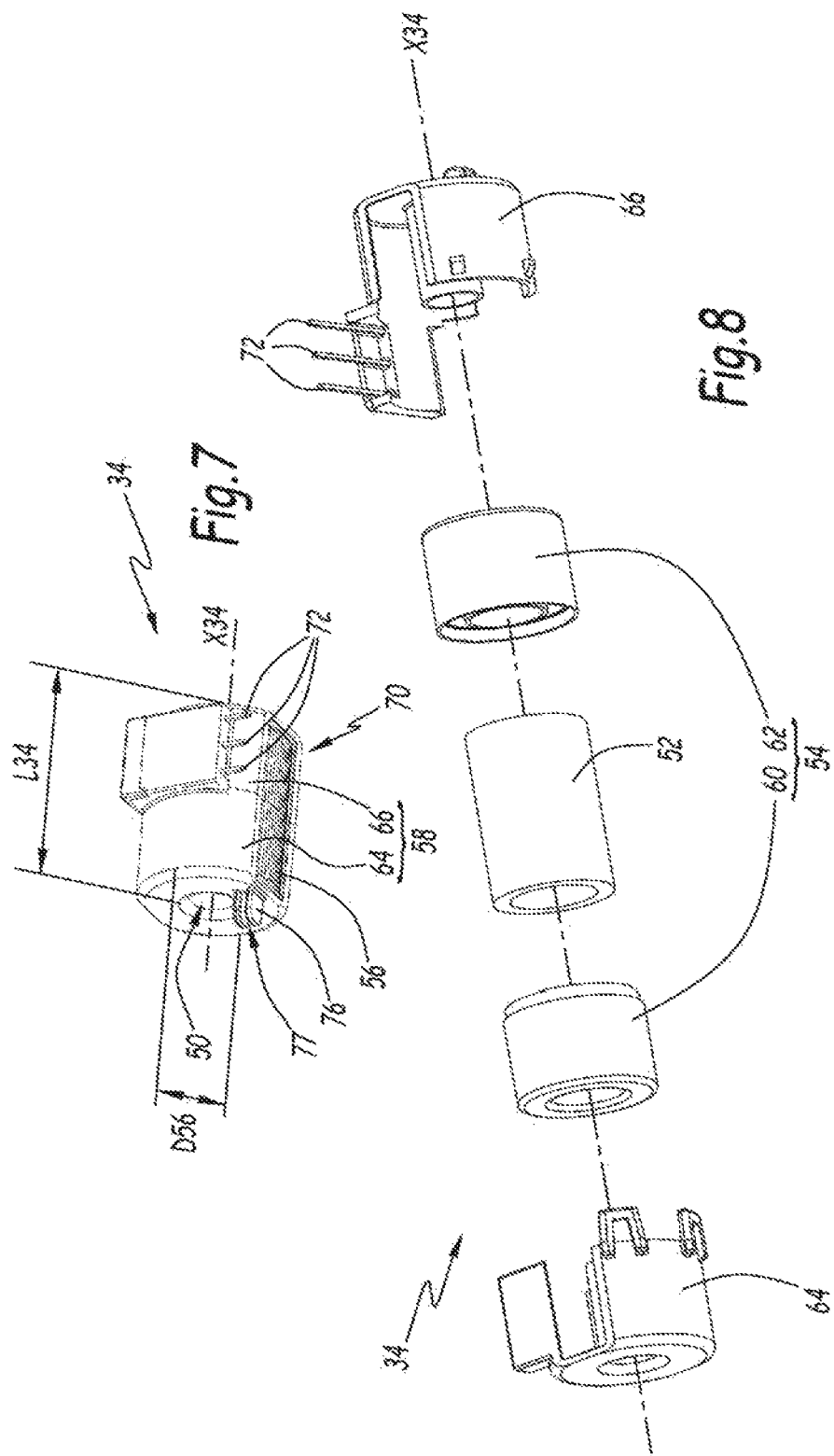

MODULE FOR DETECTING AN ELECTRICAL FAULT FOR AN ELECTRICAL PROTECTION ASSEMBLY AND ELECTRICAL PROTECTION ASSEMBLY COMPRISING SUCH A DETECTION MODULE

The present invention relates to a detection module of an electrical fault for an electrical protection assembly as well as an electrical protection assembly comprising an apparatus for breaking an electrical current and such a detection module.

Electrical protection assemblies are known which are formed by an apparatus for breaking an electrical current, such as a circuit breaker, which is associated with one or more detection modules, each one able to detect an electrical fault within a power supply line. Such assemblies are generally mounted on an electrical panel in order to provide protection for an electrical installation.

Typically, each detection module is designed to detect one specific type of electrical fault and to control the tripping of the breaking device as a consequence. Thus, in order to ensure an effective protection for the electrical installation, the protection assembly comprises several detection modules, which are associated with and coupled to the breaking device.

For example, a so-called differential detection module is designed to detect the presence of a residual electric current on a power supply line. Another detection module is adapted to detect the presence of an electric arc on a power supply line.

However, such a configuration has the drawback of being very bulky, since one has to use, for each phase of the power supply line, as many modules as there are types of faults to be protected against.

This presents a problem in cases where the electrical panel does not afford sufficient room to accommodate several detection modules, for example in the case of industrial installations having a large number of power supply lines, or when one is modernizing an existing installation without being able to increase the size of the electrical panel at will. In this case, for lack of space, often some of the protection modules are not installed, so that the protection assembly then does not afford protection against certain types of electrical faults.

This also complicates the connection of the protection assembly to the power supply lines when the electrical panel is outfitted with connection combs whose connectors are arranged with a fixed spacing.

It is these drawbacks which the invention intends to remedy in particular by proposing a detection module of an electrical fault which is able to integrate several functions of detecting electrical faults of different kinds, while having a compact shape with a bulk and dimensions which are compatible with the existing installations.

For this purpose, the invention relates to a detection module of an electrical fault for an electrical protection assembly, this detection module comprising:
  a housing;
  a first line conductor and a second line conductor, adapted to being connected to power supply lines;
  a first measurement toroid, positioned around the first line conductor and around the second line conductor, for measuring a differential current flowing between the first and second line conductors;
  a second measurement toroid, positioned around the first line conductor, for detecting an electric arc signal flowing through this conductor;
  an electromechanical tripping relay;
  an electronic processing circuit connected to the first and second measurement toroids and configured to switch the relay according to the current measured by the measurement toroids;
this detection module being characterized in that the first and second measurement toroids are aligned with one another, while the first measurement toroid takes the shape of an elongated tube and allows the differential protection to operate with its own current.

Thanks to the invention, the detection module is able to detect electrical faults of different kinds by using components accommodated in a compact housing, for example, having a specific form factor. It is not necessary, as is the case in the known protection assemblies, to use one detection module for each type of electrical fault. Thus, this reduces the overall bulk of the protection assembly.

According to advantageous but not mandatory aspects of the invention, such a detection module may incorporate one or more of the following characteristics, taken alone or in any technically allowable combination:
  The ratio of the length of the first measurement toroid to the diameter of the first measurement toroid is greater than or equal to 1, preferably greater than or equal to 1.5.
  The electronic processing circuit comprises at least one electronic card, and the relay has a flattened shape with a thickness less than or equal to 12 mm, the relay being secured to said electronic card.
  The electronic processing circuit also comprises an additional electronic card superimposed on the other electronic card, the relay being intercalated between the electronic cards by being placed in contact with these electronic cards.
  The width of the detection module is equal to 18 mm.
  The length of the first measurement toroid, measured along the longitudinal axis, is between 15 mm and 50 mm.
  The first measurement toroid comprises, arranged in coaxial manner, a hollow central passage, a toroidal magnetic core surrounding the hollow central passage, a first housing which surrounds the magnetic core, a coil formed by a winding of a conductive wire around the first housing, and a second housing which covers the coil at least partly
  The first measurement toroid is connected to an electronic card of the electronic processing circuit and the second housing of the first measurement toroid comprises a support lug in the form of a tab, said electronic card having a cavity of complementary shape to the support lug, the support lug being received in this cavity.

According to another aspect, the invention relates to an electrical protection assembly comprising a breaking device for an electrical current and a detection module for at least one electrical fault, this detection module being associated with the breaking device and being designed to control the tripping of this breaking device, this electrical protection assembly being characterized in that the detection module is as described previously.

According to advantageous but not mandatory aspects of the invention, such an electrical protection assembly may incorporate one or more of the following characteristics, taken alone or in any technically allowable combination:

The housing is common to the detection module and to the breaking device.

The breaking device comprises an additional housing distinct from the housing of the detection module, it being possible to separate the breaking device and the detection module from each other.

The invention will be better comprehended and its other advantages will appear more clearly in light of the following description of one embodiment of a detection module given solely as an example and with reference to the enclosed drawings, in which:

FIGS. 7 and 8 are schematic representations of a current measurement toroid belonging to the protection device of FIGS. 2 to 5, respectively illustrated in an isometric view and an exploded view;

Figure 1:
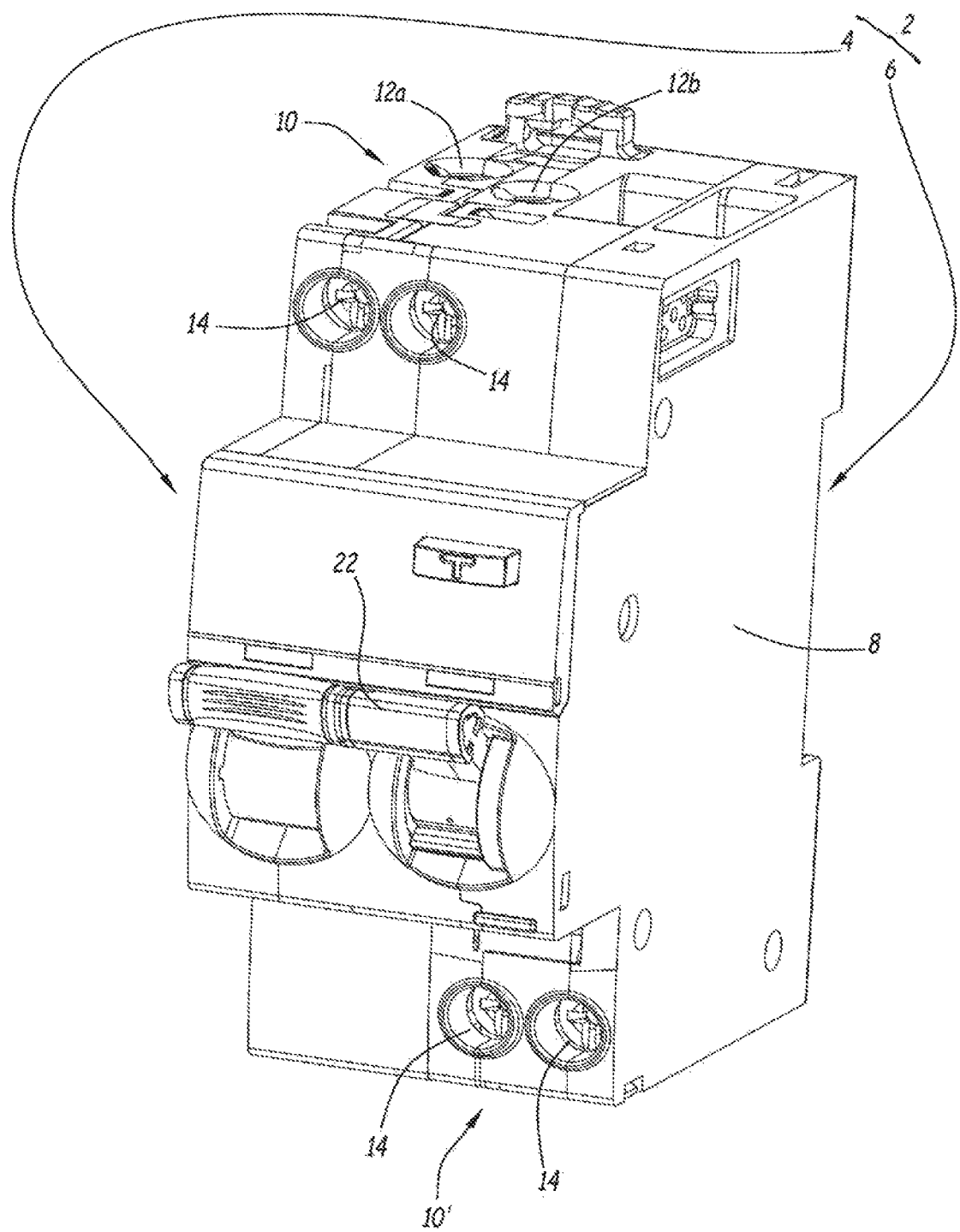
FIG. 1 is a schematic representation of an electrical protection assembly comprising a detection module according to one embodiment of the invention.

FIGS. 1 to 6 represent a protection assembly 2 according to a first embodiment of the invention. The assembly 2 comprises a breaking device 4 for an electric current, such as a circuit breaker or an isolator or a switch, and a detection module 6 for an electrical fault.

The assembly 2 is intended to be electrically connected to a power supply line in order to provide protection for an electrical installation. In particular, the assembly 2 here is intended to be mounted within an electrical panel.

In this example, the power supply line comprises a first line conductor and a second conductor adapted to carry an electric current. Thus, it will be understood that these line conductors are outside the assembly 2 and are intended to be connected electrically to it.

In this exemplary illustration, the power supply line transports a single-phase current, so that the first and second line conductors are respectively a phase conductor and a neutral conductor.

As a variant, however, the power supply line may serve to carry direct current, the assembly 2 then being designed to operate in a direct-current electrical installation. The terms "phase conductor" and "neutral conductor" correspond to an exemplary illustration and the embodiments described below are applicable to the case of a direct-current installation. Thus, the first and second line conductors may be associated with something other than a phase and a neutral, respectively.

The device 4 is adapted to switch between an open state, preventing the flow of current on the power supply line, and a closed state, allowing the flow of current on this power supply line. As is known, this switching is implemented for example by means of separable electrical contacts.

The module 6 is designed to detect an electrical fault on the power supply line and, in response, to trip the switching of the device 4 from its closed state to its open state. To do so, the module 6 is coupled to the device 4, for example, in a mechanical manner, as explained below.

The module 6 here is designed to detect two types of electrical faults: a residual current fault, also called a differential fault, and a fault of electric arc type.

The differential fault corresponds here to the abnormal presence of a difference in current strength between the phase and neutral lines of the same power supply line.

The electric arc fault corresponds here to a particular form of the electric current in the phase line due to the appearance of an electric arc in the power supply line, which thus forms a specific signature. This signature thus corresponds to an electric arc signal.

In fact, the module 6 here is said to be a multifunction detection module.

The module 6 here comprises a protective housing 8, such as a moulded housing, preferably made of a rigid polymer, such as a plastic material. In the following, the components ensuring the functioning of the module 6 are collectively denoted by the reference 6'. These components 6' are lodged inside the housing 8.

In this embodiment, the housing 8 is common to the module 6 and to the device 4. Advantageously, the respective components of the device 4 and the module 6 are then lodged in distinct areas inside the housing 8, preferably in two separate compartments of the housing 8. As a variant, the device 4 and the module 6 may be lodged in two different housings which are then joined together, it being possible to separate the device 4 and the module 6 from each other.

The width of the module 6 here is equal to 18 mm.

The width of the assembly 2 is denoted as L2. The width L2 here is equal to 36 mm. This width L2 is measured here on one face of the assembly 2, in a direction perpendicular to outside lateral faces of the assembly 2. Here, since the housing 8 is in common, the width L2 corresponds to the width of this housing 8 and the width of the module 6 is equal to half of the width L2.

Thus, the assembly 2 is compatible with known electrical panels provided with standardized slots, each one having a width of 18 mm. The element 2 then occupies two such slots when it is mounted on such an electrical panel.

In order to allow its connection to the power supply line, the assembly 2 comprises a first connection area 10 and a second connection area 10'. For example, the first area 10 corresponds to an input and the second area 10' corresponds to an output of the assembly 2.

In this embodiment, the area 10 is arranged in the area of the device 4 and the area 10' is arranged in the area of the module 6, here on respectively upper and lower faces of the assembly 2. An electrical interconnection device internal to the assembly 2, not shown, allows the electrical connecting of the components of the device 4 to those of the module 6.

The area 10 comprises two connection terminals 12a and 12b, respectively able to receive the corresponding conductors of the phase line and the neutral line. These terminals 12a and 12b are arranged here in an opening devised in the corresponding wall of the housing 8. For example, these holes are arranged side by side, set apart in a direction perpendicular to the front face of the housing 8.

Screws 14 accessible from the front face of the assembly 2 make it possible to attach these conductors to the connection terminals 12a and 12b.

In a similar manner, the area 10' here is provided with connection terminals similar to the terminals 12a, 12b, which are not shown here.

As illustrated in FIGS. 2 to 5, the module 6 comprises a trip mechanism 20, here provided with a control lever 22 and a mechanical coupling element 24.

The lever 22 is preferably accessible from the outside of the housing 8, for example, to be manipulated by an operator.

The element 24 cooperates with the device 4 so as to bring about its switching between the open and closed states depending on the state of the mechanism 20.

Figure 6:
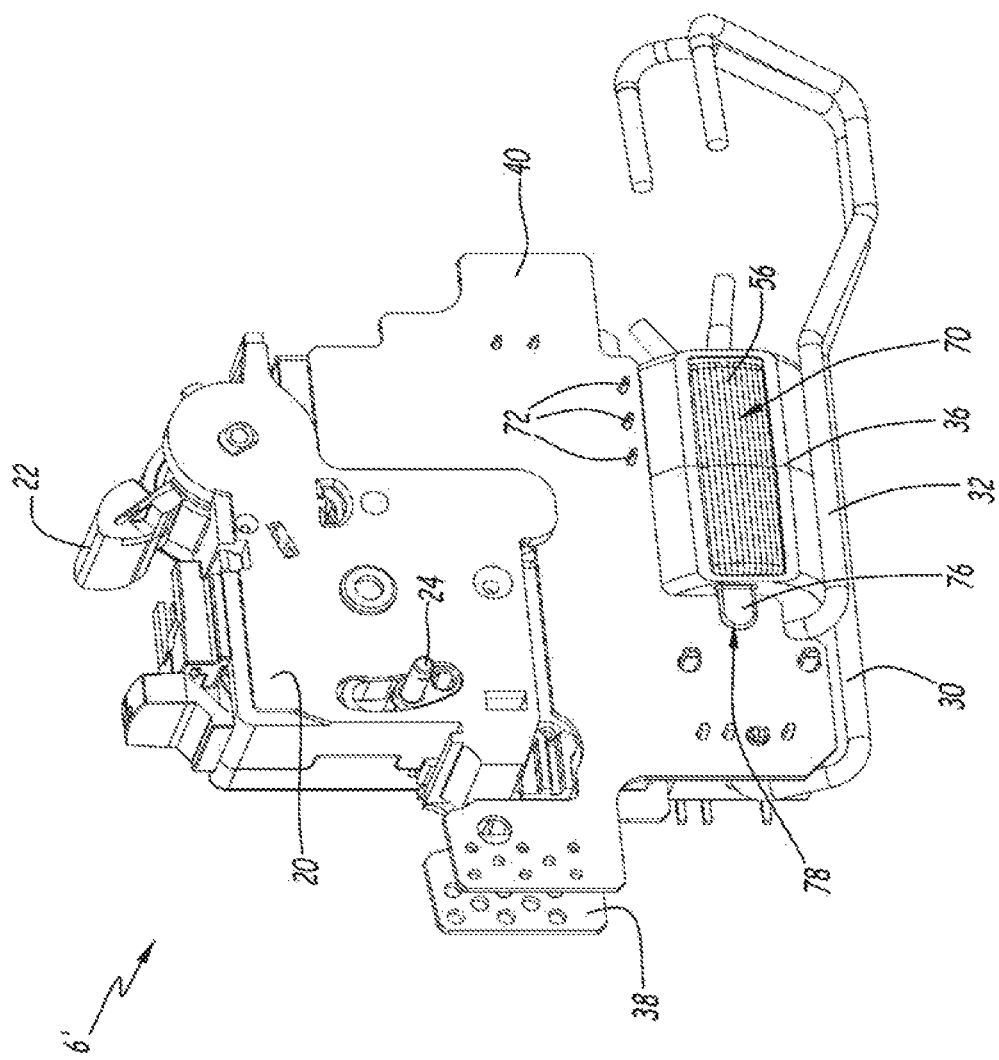
FIG. 6 is a schematic representation of the detection module of FIG. 3, in an opposite perspective view.

In this example, as will be seen more clearly in FIG. 6, the element 24 takes the form of a movable pin which cooperates with a corresponding mechanical element inside the device 4. For example, when the device 4 is a circuit breaker, the element 24 then cooperates with a tripping mechanism of this circuit breaker.

The module 6 likewise comprises a first internal line conductor 30, a second internal line conductor 32, a first current measurement toroid 34 and a second current measurement toroid 36, as well as an electronic processing circuit.

In this example, the conductors 30 and 32 are internal to the module 6 and are distinct from the line conductors of the power supply line.

In this embodiment, the conductor 30 is a phase conductor and the conductor 32 is a neutral conductor. The conductors 30 and 32, as a variant, may be associated with something other than a phase and a neutral, respectively, especially when the currents are direct currents.

The conductors 30 and 32 are for example each realized in an electrically conductive material, such as copper, for example in the form of a rigid wire. These conductors here each have a diameter greater than or equal to 2 mm or 2.35 mm, making it possible to obtain here a rating of 40 Amperes.

The phase conductor 30 and the neutral conductor 32 are connected to corresponding connection terminals of the assembly 2. In this example, the conductors 30 and 32 have one of their ends which is connected to the corresponding terminals of the area 10', and their opposite end which is connected to the components of the device 4.

The measurement toroids 34 and 36 here are magnetic current measuring toroids.

The measurement toroids 34 and 36 are each disposed along a longitudinal axis.

The toroid 34 has the shape of an elongated tube with a substantial magnetic circuit to allow the differential protection to operate with its own current. The phrase "with its own current" means here that the toroid 34 is self-powered electrically, that is, in event of a differential fault between the conductors 30 and 32, the toroid 34 is able to generate a fault detection signal from induced currents generated by the electric currents flowing in the conductors 30 and 32. Thus, this function does not require an auxiliary power supply.

The toroid 36 serves for the detection of an electric arc. For example, it has a flattened tubular or wafer shape. The toroid 36 here is smaller but operates with a complex processing and a powered electronic card.

By X34 is denoted the longitudinal axis of the first toroid 34 and by X36 is denoted the longitudinal axis of the second toroid 36.

The measurement toroids 34 and 36 are parallel and aligned with each other. Preferably, despite their alignment, the toroids 34 and 36 are slightly off-centre to each other, as is seen more particularly in FIG. 5. In other words, the axes X34 and X36 are parallel yet not coincident with each other. They are set apart by a slight distance, for example less than 10 mm or less than 5 mm. Preferably, for example, the conductor 30 is centred on the axis X36 and the conductors 30 and 32 are arranged on either side of the axis X34. Thus, the toroids 34 and 36 here are substantially aligned around the conductor 30. This facilitates the passage of the conductors 30 and 32 and decreases the bulk of the toroids 34 and 36.

The first measurement toroid 34 is arranged around the phase conductor 30 and the neutral conductor 32. For this purpose, the conductors 30 and 32 each have a portion which is received in a hollow central passage 50 of the first toroid 34, these portions being arranged substantially parallel to each other in the area of this central passage 50, being aligned parallel to the longitudinal axis X34.

The first toroid 34 is adapted to measure a difference in the electric current flowing between these conductors 30 and 32.

As is known, in the presence of an electrical fault caused by a leakage current in the electrical installation in the area of the power supply line, the electric current flowing in the neutral line has a different strength from the current flowing in the associated phase line, whereas normally the two currents should have the same strength.

Thus, in a normal case, in the absence of such a fault, the current flowing in the neutral conductor 32 has the same strength as that which is flowing in the phase conductor 30, but it flows in the opposite direction. The magnetic fields generated by these currents flowing in the opposite direction thus cancel out in the area of the first toroid 34, such that the total magnetic flux measured by the first toroid 34 is zero. In the case when such a fault is present, the magnetic fields then do not compensate for each other and the first toroid 34 detects a nonzero total flux.

The first toroid 34 thus allows a detecting of the presence of a residual current, and it therefore allows the assembly 2 to implement a differential protection function with its own current. In particular, the detection signal emitted by the toroid 34 here is sufficient to trip the switching of the relay 42 as described below. Thus, the differential protection function with its own current does not require an outside power supply, but needs a toroid 34 of sufficient size to control the actuation of the relay.

As for the second measurement toroid 36, this is arranged about the phase conductor 30, to measure an electric current flowing in this conductor 30.

For this purpose, the conductor 30 is received in a hollow central passage of the second toroid 36, but here the neutral conductor 32 is not received inside this hollow central passage. For example, the conductor 32 has a curved shape.

As for the second toroid 36, this makes it possible to measure a characteristic signature of an electric arc fault in the line current flowing in the conductor 30, this signature corresponding here to a signal representative of particular electric arcs, and thus it allows the assembly 2 to implement a protection function against electric arcs.

The electronic processing circuit is programmed to collect the current measurement signals provided by the measurement toroids 34 and 36, and to automatically determine the presence of an electronic fault as a function of these measurement signals.

The electronic processing circuit has at least one electronic card, preferably two electronic cards, serving as a support for electronic components allowing the processing of the measured signals. As an illustrative example, these components include a logic calculation unit and/or one or more digital or analogue comparators, as well as a power supply circuit. The electronic circuit may also comprise a power module, adapted to provide a regulated electrical power supply from an outside power supply source. For example, this regulated power supply is meant to power the processing components and the toroid 36.

The electronic processing circuit here comprises a first electronic card 38 and a second electronic card 40. In this exemplary illustration, the card 38 is a processing card and it comprises the associated processing components, and the card 40 is a power supply card and it comprises the power module.

The first and second electronic cards 38, 40 here are arranged in parallel and superimposed on one another. For example, the first and second electronic cards 38, 40 are arranged in parallel with the lateral walls of the housing 8.

The first and second electronic cards 38, 40 here are formed from rigid supports of PCB type made of epoxy resin, on which there are arranged electrically conductive tracks, and the electronic components are mounted on them. Preferably, they have a shape similar to each other.

The measurement toroids 34 and 36 here are advantageously lodged in the area of an indentation made at a lower edge of these electronic cards 38 and 40. In this example, the toroid 34 is arranged between the toroid 36 and the second area 10'.

The module 6 includes an electromechanical tripping relay 42, which is connected to the electronic processing circuit and which is mechanically coupled to the mechanism 20.

The relay 42 is able to switch between several distinct states, for example at least two states.

The electronic processing circuit is programmed to trip the relay 42 when it detects an electrical fault based on the measurement signals provided by one or the other of the first toroid 34 and the second toroid 36, or of the two measurement toroids 34 and 36.

When the relay 42 switches from a first state to a second state, it modifies the state of the mechanism 20, which results in a switching of the breaking device 4, here by means of the element 24. In other words, the mechanism 20 here serves to amplify the movement and to transmit a change of state to the breaking device 4. Thus, the module 6 here controls the device 4 by means of the tripping relay 42 and the mechanism 20.

The relay 42 advantageously has reduced dimensions.

Preferably, the relay 42 has a flattened shape, for example, a slab shape whose base has a substantially rectangular shape.

The thickness E42 of the relay 42 is less than or equal to 12 mm, or preferably less than or equal to 10 mm, and more preferably still less than or equal to 8.5 mm. The thickness E42 here is equal to 8.3 mm.

For example, the relay 42 is secured and electrically connected to one of the electronic cards 38, 40, resting on this electronic card, such that the direction in which the thickness E42 is measured is substantially perpendicular to this electronic card.

In this example, the relay 42 is arranged between the first and second electronic cards 38, 40, preferably being placed in contact with these first and second electronic cards 38, 40. The distance between the first and second electronic cards 38, 40 is then adapted as a consequence.

The electronic cards 38, 40 and the relay 42 here are arranged in a central area of the housing 8, between the mechanism 20 on the one hand and the toroids 34, 36 on the other hand.

The first toroid 34 here takes the shape of an elongated tube along the longitudinal axis X34. In this example, the first toroid 34 has a substantially cylindrical shape with its directrix axis coinciding with the longitudinal axis X34.

By L34 is denoted the length of the first toroid 34, here being measured parallel to the longitudinal axis X34. The length L34 is preferably between 15 mm and 50 mm.

By D56 is denoted the diameter of the first toroid 34.

Advantageously, the ratio of the length L34 to the diameter D34 is greater than or equal to 1, and preferably greater than or equal to 1.5, or more preferably still greater than or equal to 2.

As illustrated in FIGS. 7 and 8, the first toroid 34 comprises, arranged in a coaxial manner about the longitudinal axis X34, the previously described hollow central passage 50, a toroidal magnetic core 52 surrounding the central passage 50, a first housing 54 which surrounds the magnetic core 52, a coil 56 formed by a winding of a conductive wire around the first housing 54, and a second housing 58 which covers the coil 56 at least partly.

The diameter D56 here is measured at the outer perimeter of the coil 56.

The magnetic core 52 here has a toroidal shape and is made of a magnetic material, such as a nanocrystalline material.

The first housing 54 here is made from a rigid and nonmagnetic material, such as plastic. The same is the case for the second housing 58 here.

In this example, the first housing 54 is formed by assembling two half-shells 60, 62. In a similar fashion, the second housing 58 is formed here by assembling two half-shells 64, 66. As a variant, the housings 54 and/or 58 can be made in a different manner.

Advantageously, the second housing 58 is provided with at least one oblong window 70 which extends longitudinally in parallel with the longitudinal axis X34 and at least partly exposing the coil 56.

Figure 2:
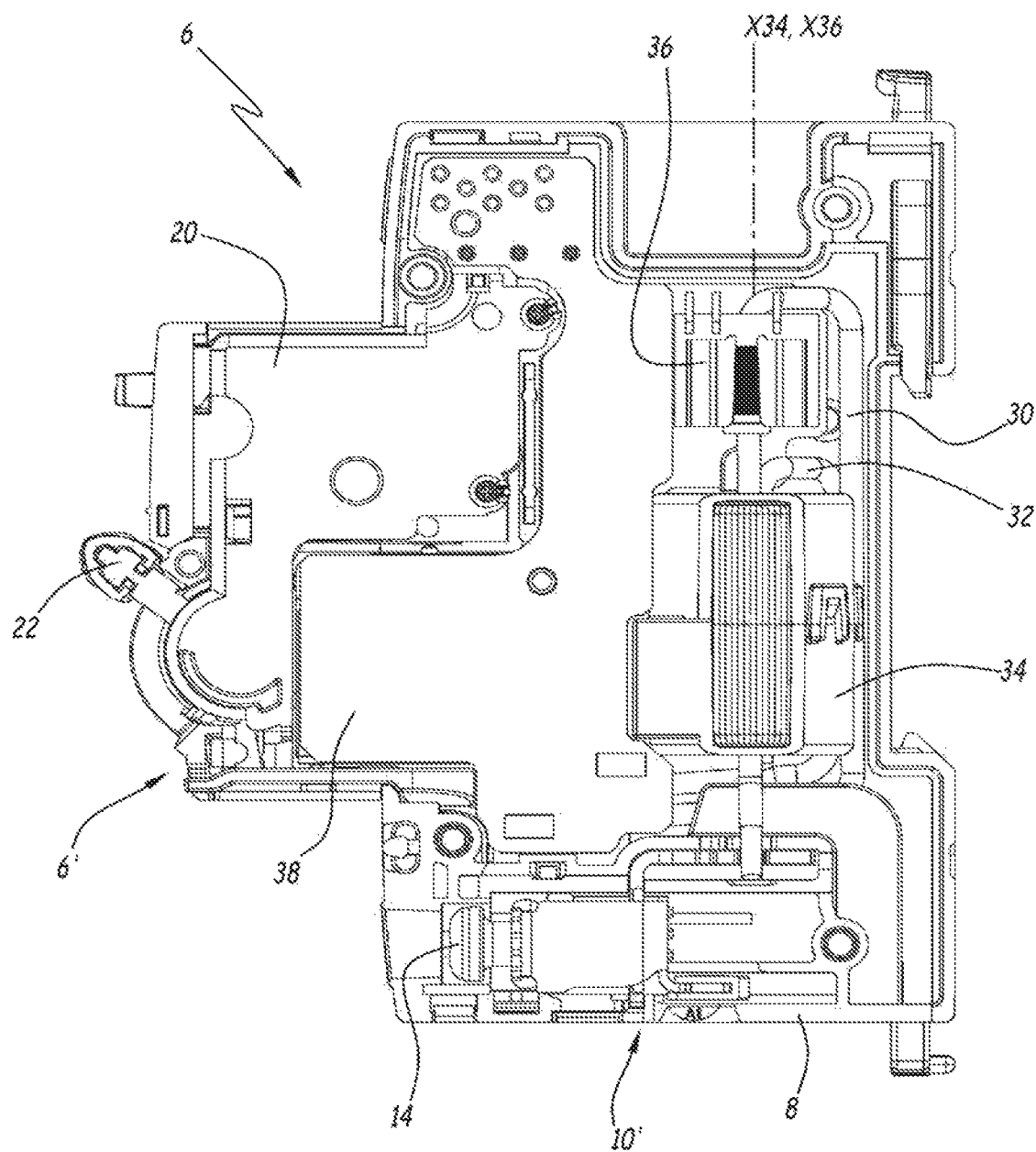
FIG. 2 is a schematic representation of the detection module of the assembly in FIG. 1, in a longitudinal section view.
Figure 3:
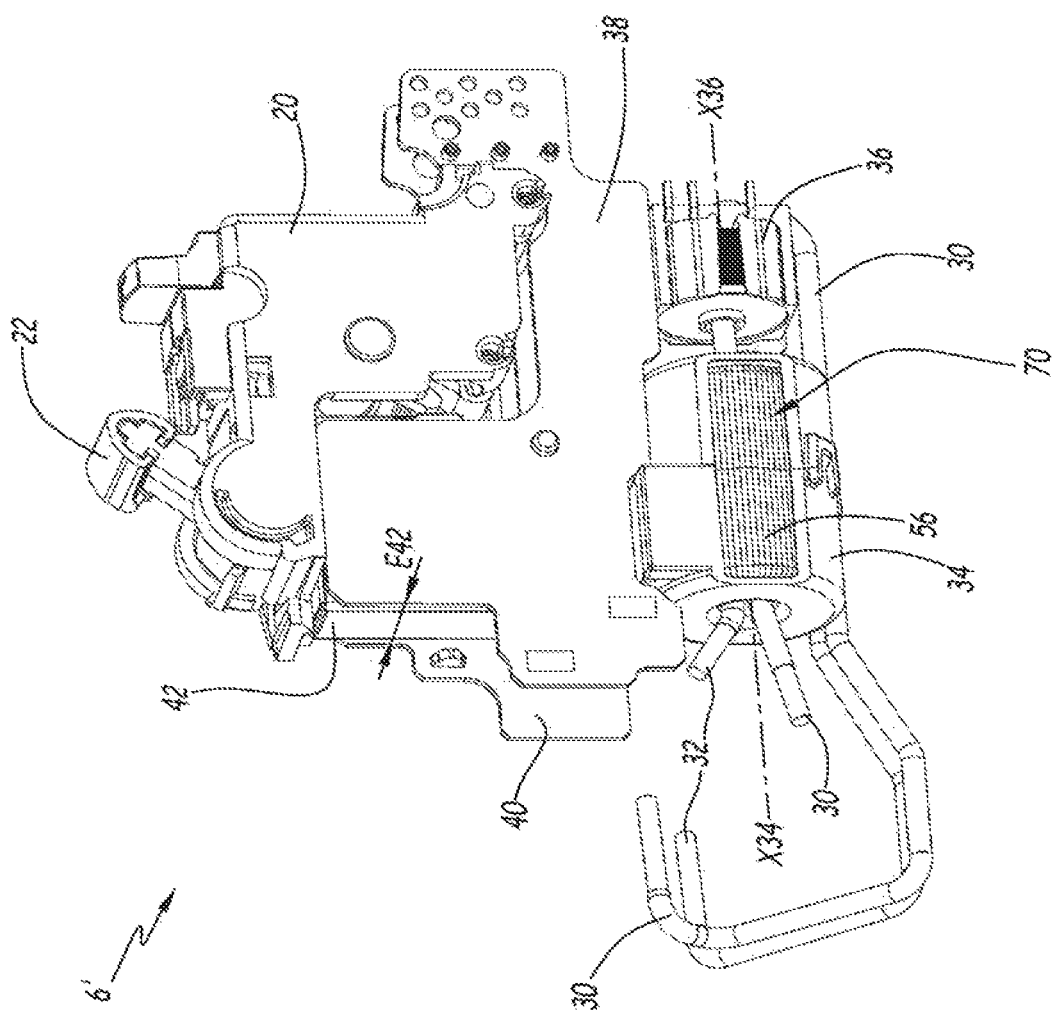
FIG. 3 is a schematic representation of the detection module of FIG. 2, in a perspective view.
Figure 4:
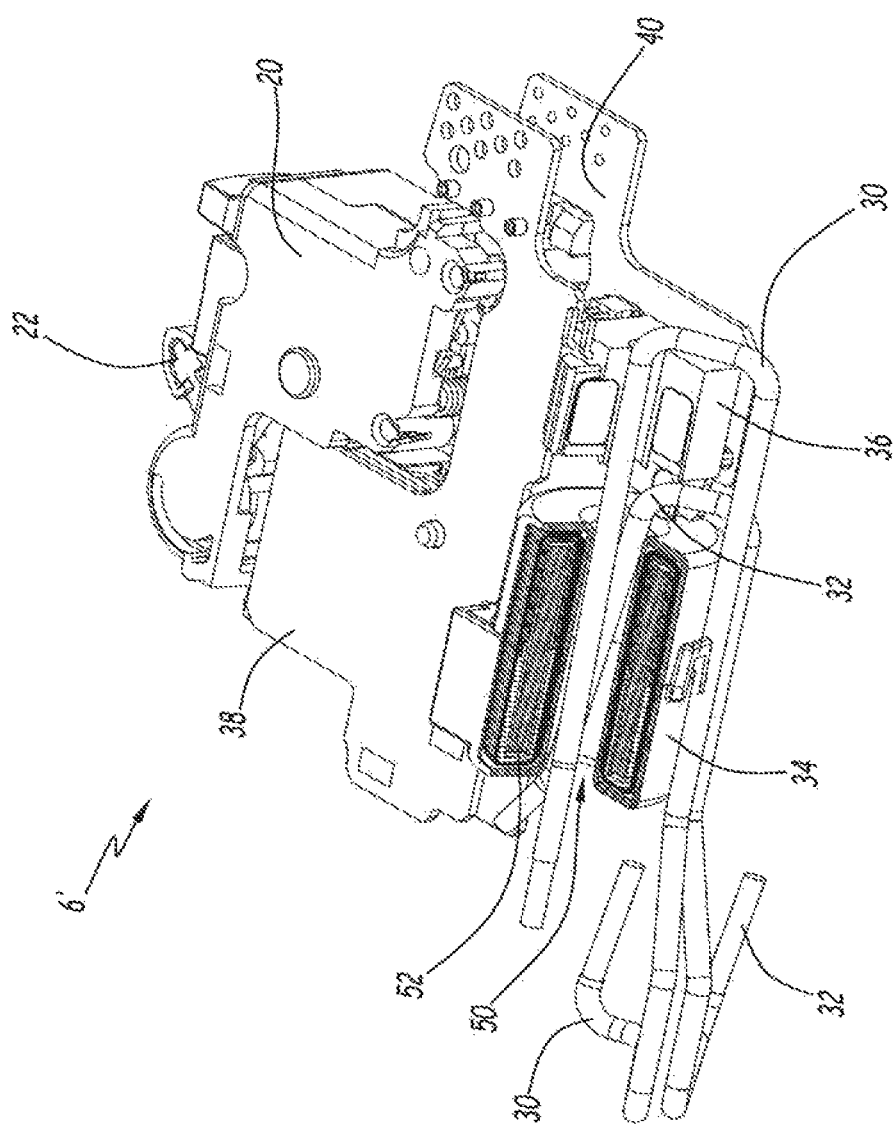
FIG. 4 is a schematic representation of the detection module of FIG. 3, in a perspective view in which first and second measurement toroids are illustrated in a cutaway view.
Figure 5:
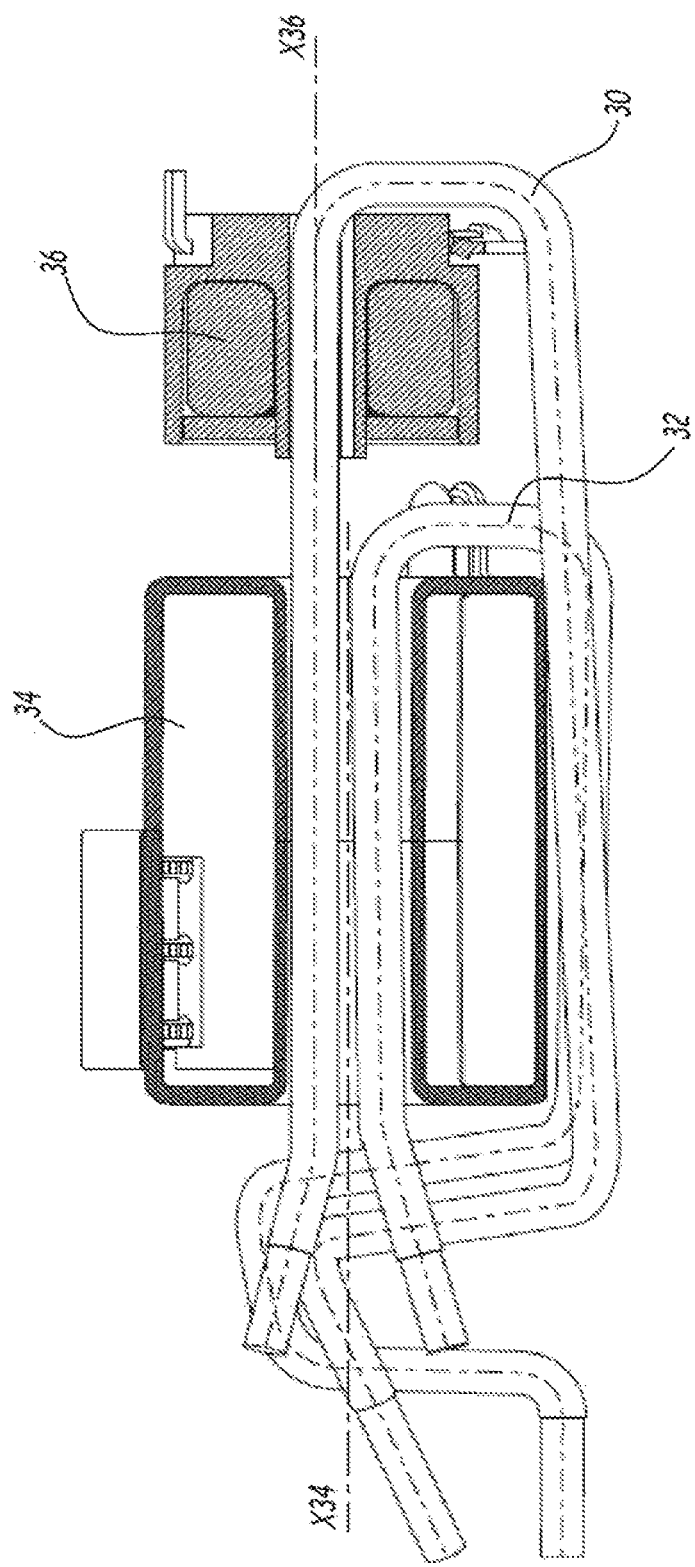
FIG. 5 is a schematic representation of a cross section view of the first and second measurement toroids of FIG. 4.

More precisely, the coil 56 is formed here by winding a conductive wire around the first housing 54 so as to form several turns disposed radially with respect to the longitudinal axis X34 and spaced apart from each other, this wire extending in parallel with the directrix axis X34, as is seen in particular in FIGS. 2 and 3.

In particular, it is advantageously not necessary here to make several turns of phase and neutral conductors, such as is the case with the known measurement toroids of ring or wafer shape. Thus, the fragility of the coil 56 is reduced, and it is then not necessary to utilize a third housing for exterior protection, surrounding the second housing 58, unlike what is usually needed in the known measurement toroids of ring or wafer shape. Thanks to this, the first toroid 34 is more compact.

In this example, the first toroid 34 is mounted on the electronic card 40.

The first toroid 34 comprises electrical connection pads 72 which are connected by welding to the electronic card 40. These pads 72 are connected here to the ends of the coil 56 and make it possible to send the signal measured by the first toroid 34 to the electronic processing circuit.

Advantageously, the second housing 58 of the first toroid 34 comprises a support lug 76 in the form of a tab, of rounded shape here. The electronic card 40 has a cavity 78 of complementary shape to the support lug 76, the support lug 76 being received in this cavity 78.

The support lug 76 here comprises a groove 77 formed on its perimeter and bounded by end edges. This groove 77 receives one edge of the electronic card 40 when the first toroid 34 is in a configuration mounted on the second electronic card 40.

The support lug 76 enables an absorbing of the mechanical force exerted by the first toroid 34 on the electronic card 40, serving as a support for it, and in particular prevents these mechanical forces from being borne solely by the connection pads 72, which would likely damage them, since they are primarily dimensioned to provide an electrical connection and not to bear a mechanical load.

Thanks to the invention, the module 2 is able to detect electrical faults of different kinds by using the same assembly of components 6'. It is then said that the module 2 affords a dual protection. It is not necessary, as in the case of the known protection assemblies, to use one detection module for each type of electrical fault. Thus, the bulk of the protection assembly 2 is reduced, especially within an electrical panel. This likewise reduces its cost.

In particular, because of the fact that the width of the module 6 here is equal to 18 mm and the width L2 is equal to 36 mm, the assembly 2 may be installed in existing electrical panels having standardized slots of 18 mm. This is particularly advantageous when the assembly 2 is installed at existing installations, such as during modernization or "retrofitting" operations.

Moreover, when the assembly 2 needs to be mounted on an electrical panel outfitted with connection combs, because of the reduced bulk it is easier to install and connect this assembly 2 than a conventional assembly having several detection modules. Once again, this facilitates the use of the assembly 2 at existing installations, such as during retrofitting operations.

Moreover, the choice of the components 6' and their arrangement inside the housing 8 make it possible to reduce the bulk of the module 6.

This is realized in particular thanks to the first toroid 34, especially because of its shape and its arrangement in the module 6. The known toroids typically have a ring or wafer shape and need to be secured to one of the electronic cards, perpendicular to the latter, which causes an increased bulk on account of their form factor. Moreover, in such known toroids, the coil is necessarily realized by winding the wire several times around the same armature, so as to superimpose several layers of turns. Now, such an arrangement increases the fragility of the coil, which requires the use of a stronger and thus more bulky protection housing.

The fact of using two electronic cards 38, 40 superimposed on one another makes it possible here to accommodate all the electronic components needed for the processing of the measurement signals and provide a detecting of different electrical faults within a reduced volume as compared to the case of using a single electronic card of larger surface and dimensions.

This miniaturisation is likewise achieved thanks to the reduced size of the relay 42, and especially its thickness E42, as well as its arrangement inside the module 6.

Figure 9:
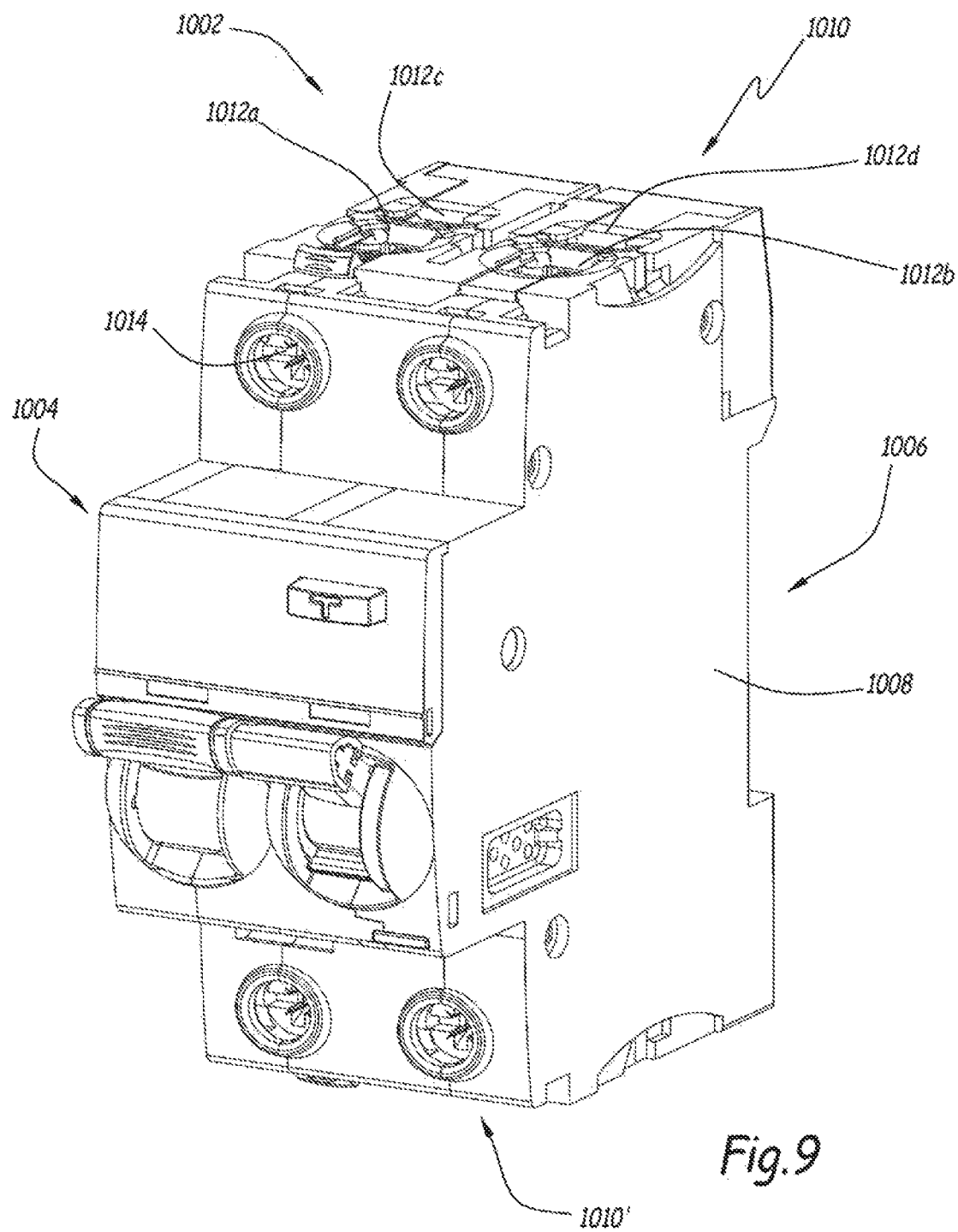
FIG. 9 is a schematic representation of an electrical protection assembly according to a second embodiment of the invention.

FIG. 9 shows a protection assembly 1002 according to a second embodiment of the invention. The elements of the detection module of this embodiment which are analogous to the protection assembly 2 of the first embodiment carry the same reference numbers, increased by the value of 1000. These elements are not described in detail, since the above description may be applied to them. In particular, everything described above in regard to the functioning of the module 6 and its components 6' applies here to the module 1006.

The assembly 1002 differs in particular from the assembly 2 by the shape and the arrangement of the connection areas 1010 and 1010'.

Here, the area 1010 comprises two connection terminals 1012a and 1012c arranged in the area of the device 4 and associated with the same fixation screw 1014, and two connection terminals 1012b and 1012d arranged in the area of the module 1006 and associated with another same fixation screw 1014.

A neutral or phase conductor of the power supply line, exterior to the device 4, is designed to be connected either to the terminal 1012a or to the terminal 1012c. Likewise, the other phase or neutral conductor is designed to be connected either to the terminal 1012b or to the terminal 1012d.

The internal electrical interconnection device is consequently modified here.

The area 1010' is realized in analogous manner.

In this example, the housing 1008 is common to the device 1004 and to the module 1006. The width of the assembly 1002, measured analogously to the width L2, is equal here to 36 mm. Likewise, the width of the module 1006 is equal here to 18 mm.

Figure 10:
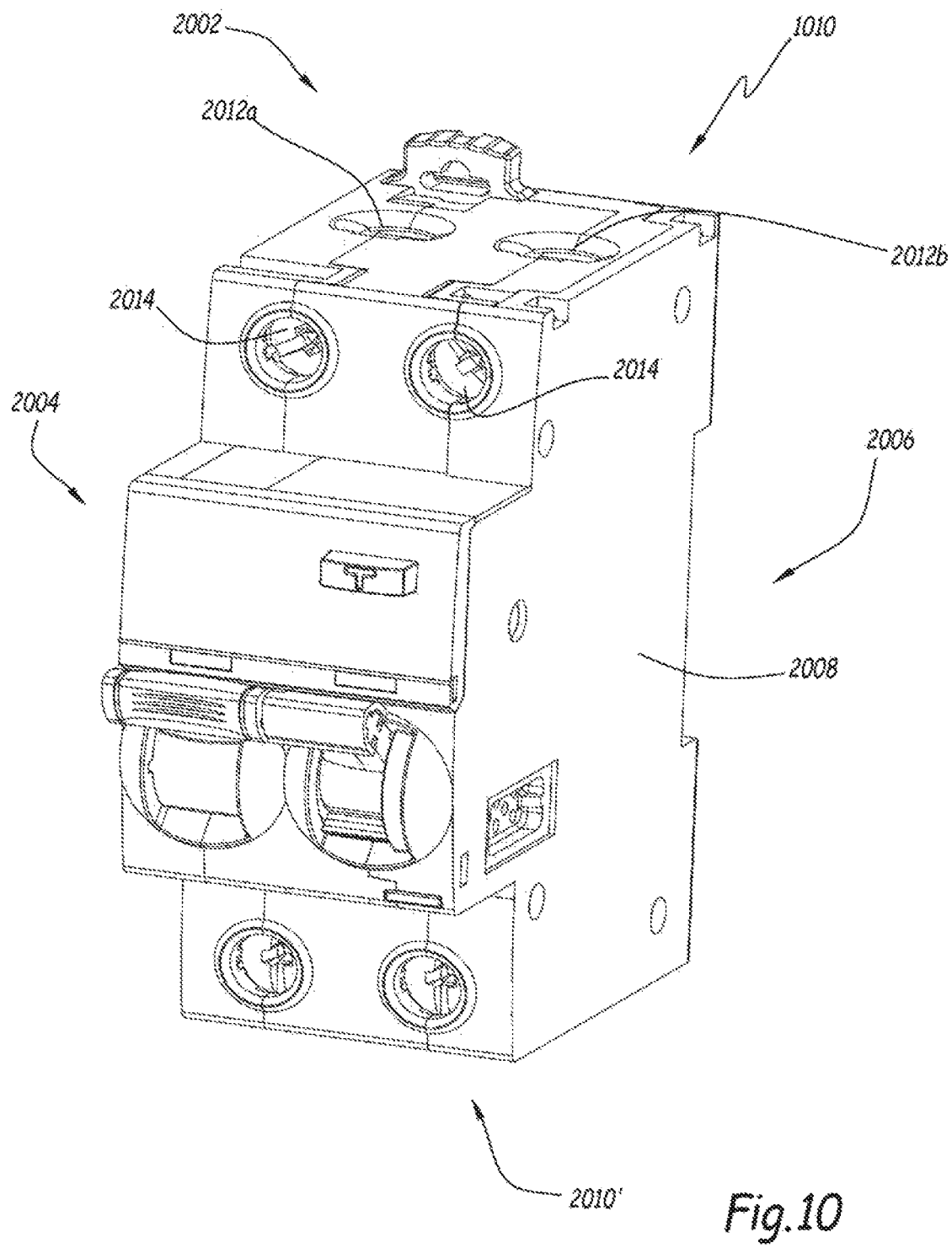
FIG. 10 is a schematic representation of an electrical protection assembly according to a third embodiment of the invention.

FIG. 10 shows a protection module 2002 according to a third embodiment of the invention. The elements of the detection module of this embodiment which are analogous to the protection assembly 2 of the first embodiment carry the same reference numbers, increased by the value of 2000. These elements are not described in detail, since the above description may be applied to them. In particular, everything described above in regard to the functioning of the module 6 and its components 6' applies here to the module 2006.

The assembly 2002 differs in particular from the assembly 2 by the shape and the arrangement of the connection areas 2010 and 2010'.

Here, the area 2010 comprises a connection terminal 2012a arranged in the area of the device 4 and associated with one fixation screw 1014, and a connection terminal 1012b arranged in the area of the module 1006 and associated with another fixation screw 1014.

The area 2010' is realized in analogous manner.

In other words, the assembly 2002 is similar to the assembly 1002, except that the terminals 1012c and 1012d are omitted here.

Figure 11:
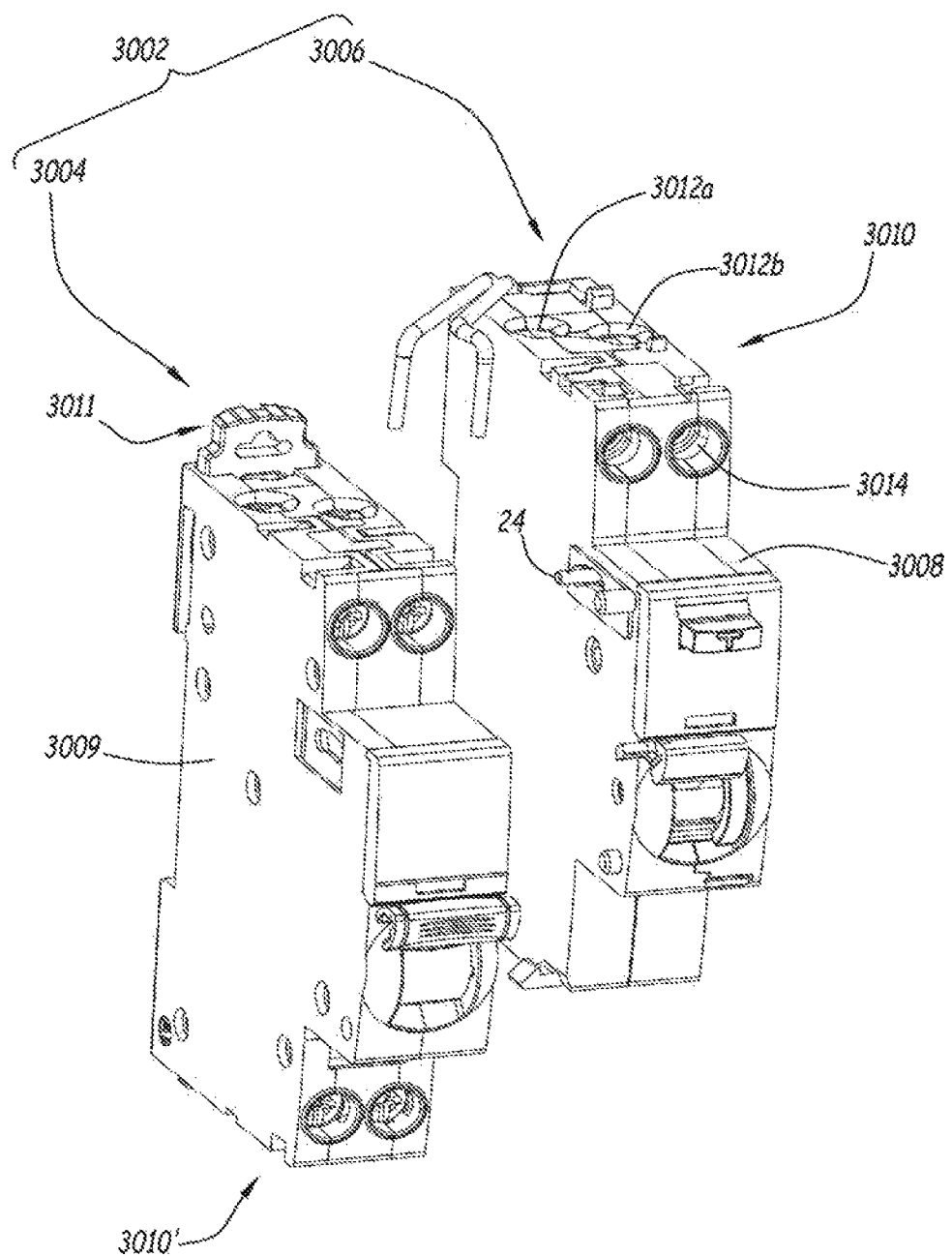
FIG. 11 is a schematic representation of an electrical protection assembly according to a fourth embodiment of the invention.

FIG. 11 shows a protection assembly 3002 according to a fourth embodiment of the invention. The elements of the detection module of this embodiment which are analogous to the protection assembly 2 of the first embodiment carry the same reference numbers, increased by the value of 3000. These elements are not described in detail, since the above description may be applied to them. In particular, everything described above in regard to the functioning of the module 6 and its components 6' applies here to the module 3006.

The assembly 3002 differs in particular from the assembly 2 by the fact that the module 3006 and the device 3004 can be separated from one another. The device 3004 comprises an additional housing 3009 which is distinct from the housing 3008 of the detection module 3006.

The width of the module 3006 here is equal to 18 mm. Likewise, the width of the device 3004 here is equal to 18 mm.

In this example, the shape and the arrangement of the connection areas 3010 and 3010' are similar to that of the areas 10 and 10', except that here the location of the areas 3010 and 3010' is offset symmetrically with respect to the location of the areas 10 and 10'. For example, while the area 10 is arranged on the device 4 on an upper left face of the assembly 2 and the area 10' is arranged on the module 6 on a lower right face of the assembly 2, the area 3010 here is arranged on the module 3006 on an upper right face of the assembly 3002 and the area 3010' is arranged on the module 3004 on a lower left face of the assembly 3002.

In this illustrative example, the device 3004 furthermore comprises a supplemental connection area 3011. This area 3011 is not necessarily used for connecting the assembly 3002 to the electrical installation being protected. In practice, this area 3001 is covered by a protective cap to prevent a user from gaining access to it when the assembly 3002 is in an assembled configuration. This area 3011 is present here because of the modular aspect of the assembly 2. Since the module 3006 and the device 3004 can be separated from each other, it is thus possible, as is the case here, to use an ordinary breaking device 3004 able to function independently in uses other than the assembly 2. This area 3011 may be omitted.

Figure 12:
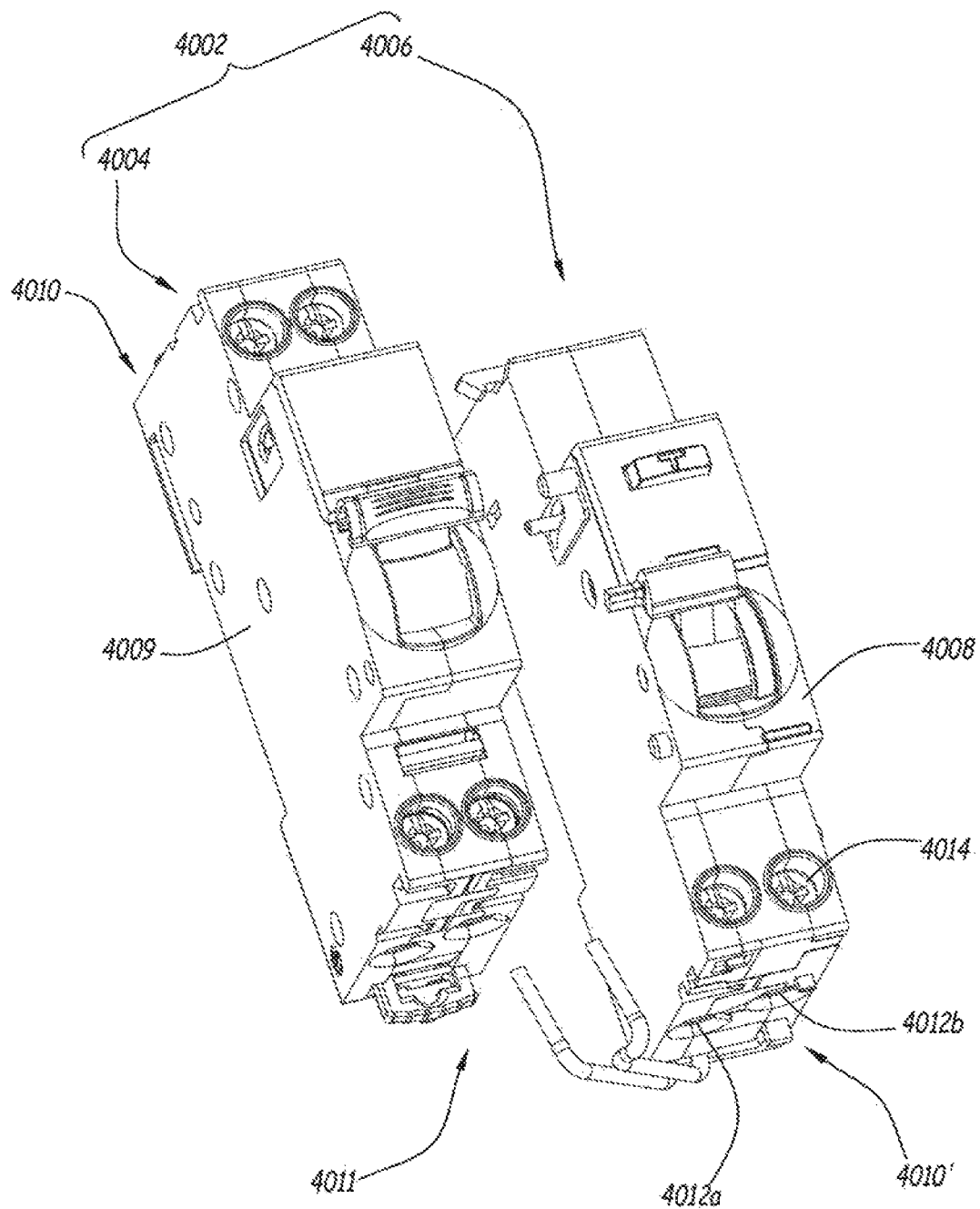
FIG. 12 is a schematic representation of an electrical protection assembly according to a fifth embodiment of the invention.

FIG. 12 shows a protection assembly 4002 according to a fifth embodiment of the invention. The elements of the detection module of this embodiment which are analogous to the protection assembly 2 of the first embodiment carry the same reference numbers, increased by the value of 4000. These elements are not described in detail, since the above description may be applied to them. In particular, everything described above in regard to the functioning of the module 6 and its components 6' applies here to the module 4006.

The assembly 4002 differs in particular from the assembly 2 by the arrangement of the areas 4010 et 4010' and by the fact that the module 4006 and the device 4004 can be separated from one another. The device 4004 comprises an additional housing 4009 which is distinct from the housing 4008 of the detection module 4006.

The assembly 4002 in particular is analogous to the device 3002, except that the areas 4010 and 4010' are arranged in opposite locations to those of the areas 3010 and 3010', respectively. For example, the area 4010 here is arranged on a lower face of the module 4006 instead of being arranged on an upper face, such as the area 3010 of the module 3006. The same is true of the areas 4010' and 4011, the latter being analogous to the previously described area 3011.

The particular configuration of the respective connection areas of the assemblies 1002, 2002, 3002 and 4002 allows an adaptation to the standards and specifications of particular markets, which further facilitates the utilization of these assemblies 1002, 2002, 3002 and 4002 at existing installations, such as during retrofitting operations.

The embodiments and the variants considered above may be combined with each other to generate new embodiments.

The invention claimed is:

1. A module for detecting an electrical fault for an electrical protection assembly, this detection module comprising:
   a housing;
   a first line conductor and a second line conductor, adapted to being connected to power supply lines;
   a first measurement toroid, positioned around the first line conductor and around the second line conductor, for measuring a differential current flowing between the first and second line conductors;
   a second measurement toroid, positioned around the first line conductor, for detecting an electric arc signal flowing through this conductor;
   an electromechanical tripping relay;
   an electronic processing circuit connected to the first and second measurement toroids and configured to switch the relay according to the current measured by the measurement toroids;
   said first and second measurement toroids are aligned with one another so that their respective longitudinal axes are parallel and offset by a distance of less than 10 mm, while the first measurement toroid takes the shape of an elongated tube and is adapted to, in the case of a differential fault between the first and second line conductors, generate a fault detection signal from induced currents generated by the electrical currents circulating in the conductors to trigger switching of the relay.

2. The detection module according to claim 1, wherein the ratio of the length of the first measurement toroid to the diameter of the first measurement toroid is greater than or equal to 1.

3. The detection module according to claim 1, wherein the electronic processing circuit comprises at least one electronic card, and wherein the relay has a flattened shape with a thickness less than or equal to 12 mm, the relay being secured to said electronic card.

4. The detection module according to claim 3, wherein the electronic processing circuit also comprises a first electronic card superimposed on a second electronic card, the relay being intercalated between the first and second electronic cards by being placed in contact with first and second electronic cards.

5. The detection module according to claim 1, wherein the width of the detection module is equal to 18 mm.

6. The detection module according to claim 1, wherein the length of the first measurement toroid, measured along the longitudinal axis, is between 15 mm and 50 mm.

7. The detection module according to claim 1, wherein the first measurement toroid comprises, arranged in coaxial manner, a hollow central passage, a toroidal magnetic core surrounding the hollow central passage, a first housing which surrounds the magnetic core, a coil formed by a winding of a conductive wire around the first housing, and a second housing which covers the coil at least partly.

8. The detection module according to claim 7, wherein the first measurement toroid is connected to an electronic card of the electronic processing circuit and wherein the second housing of the first measurement toroid comprises a support lug in the form of a tab, said electronic card having a cavity of complementary shape to the support lug, the support lug being received in this cavity.

9. An electrical protection assembly comprising a breaking device for an electrical current and a detection module for at least one electrical fault, this detection module being associated with the breaking device and being designed to control the tripping of this breaking device, this electrical protection assembly comprising the detection module is according to claim 1.

10. The electrical protection assembly according to claim 9, wherein the housing is common to the detection module and to the breaking device.

11. The electrical protection assembly according to claim 9, wherein the breaking device comprises an additional housing distinct from the housing of the detection module, it being possible to separate the breaking device and the detection module from each other.

12. The detection module according to claim 1, said first and second measurement toroids encompassing a common axis corresponding to the first line conductor,
  wherein the first line conductor includes:
    a first portion that passes through both the first measurement toroid and the second measurement toroid,
    a second portion that has curved or bent shape after passing through the second measurement toroid, and
    a third portion that externally passes the second measurement toroid and the first measurement toroid, and
  the second line conductor includes:
    a first portion that passes through the first measurement toroid but not the second measurement toroid,
    a second portion that has curved or bent shape after passing through the first measurement toroid, and
    a third portion that externally passes the first measurement toroid but not the second measurement toroid.

\* \* \* \* \*